United States Patent
Kang et al.

(10) Patent No.: US 7,272,049 B2
(45) Date of Patent: Sep. 18, 2007

(54) NONVOLATILE SEMICONDUCTOR MEMORY DEVICE HAVING UNIFORM OPERATIONAL CHARACTERISTICS FOR MEMORY CELLS

(75) Inventors: Dong Ku Kang, Sungnam-si (KR); Dae Seok Byeon, Yongin-si (KR); Young Ho Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/317,300

(22) Filed: Dec. 27, 2005

(65) Prior Publication Data

US 2007/0058428 A1 Mar. 15, 2007

(30) Foreign Application Priority Data

Sep. 9, 2005 (KR) ............ 10-2005-0083921

(51) Int. Cl.
*G11C 16/06* (2006.01)

(52) U.S. Cl. .................. 365/185.2; 365/185.23; 365/185.09

(58) Field of Classification Search ......... 365/185.02, 365/185.23, 185.09, 210, 201, 185.2
See application file for complete search history.

(56) References Cited

U.S. PATENT DOCUMENTS

| 5,524,094 | A  | * | 6/1996 | Nobukata et al. ...... 365/185.21 |
| 7,079,437 | B2 | * | 7/2006 | Hazama et al. ............ 365/210 |
| 2002/0118588 | A1 | * | 8/2002 | Kato ....................... 365/210 |
| 2004/0113199 | A1 |  | 6/2004 | Toshiba |
| 2005/0180213 | A1 | * | 8/2005 | Abe et al. ............. 365/185.17 |

FOREIGN PATENT DOCUMENTS

| JP | 2004127346 | 4/2004 |
| KR | 1019940006684 | 7/1994 |
| KR | 1020000007429 A | 2/2000 |

* cited by examiner

Primary Examiner—Gene N. Auduong
(74) Attorney, Agent, or Firm—Volentine & Whitt, PLLC

(57) ABSTRACT

A NAND-type nonvolatile semiconductor memory device comprising a cell string that comprises a dummy cell interposed between and connected in series to a string selection transistor and a nonvolatile memory cell is provided. The NAND-type nonvolatile semiconductor memory device further comprises a dummy word line driver adapted to activate a dummy word line to gate the dummy cell.

13 Claims, 5 Drawing Sheets

|  | Read and Verify Read | ERASE | Program |
|---|---|---|---|
| BL | $V_{bl}$=precharge | Floating | "0"-Vss<br>"1"-Vcc |
| SSL | Vcc | Floating | Vcc |
| WL | Select : Vr<br>Non-Select : Vread | 0V | Select : Vpgm<br>Non-Select : Vpass |
| DWL | Vread+α | 0V | Vpass |
| GSL | Vcc | Floating | 0V |
| SL | 0V | Floating | 0V |

FIG. 4

NONVOLATILE SEMICONDUCTOR MEMORY DEVICE HAVING UNIFORM OPERATIONAL CHARACTERISTICS FOR MEMORY CELLS

BACKGROUND

1. Field of the Invention

The present invention relates to nonvolatile semiconductor memory devices, and in particular the present invention relates to a nonvolatile semiconductor memory device having uniform operational characteristics for memory cells.

This application claims priority to Korean Patent Application No. 2005-83921, filed on Sep. 9, 2005, the subject matter of which is hereby incorporated by reference in its entirety.

2. Description of the Related Art

A nonvolatile semiconductor memory device comprises a plurality of memory cells, each of which comprises a floating gate and a control gate. A NAND-type nonvolatile semiconductor memory device comprises a plurality of cell strings, each of which comprises a group of memory cells that are connected in series. In a memory cell, a data bit is programmed or erased by creating a predetermined voltage difference between the control gate and a channel region of the memory cell. In accordance with the voltage difference created within the cell, electrons may be injected into the floating gate from the channel region through a tunneling current, or may move from the floating gate into the channel region. Here, the potential at the floating gate is determined by the ratio of the capacitance between the control and floating gates and the capacitance between the floating gate and the channel region.

FIG. 1 is a circuit diagram showing a cell string of a conventional NAND-type nonvolatile semiconductor memory device. Referring to FIG. 1, one end of the conventional cell string is connected to a bit line BL through a selection transistor SG1, while the other end of the cell string is connected to a source line SL through the other selection transistor SG2. As nonvolatile semiconductor memory devices have become more densely integrated, the intervals between adjacent memory cells, such as memory cells MC1~MC32, have decreased in size. Due to the decrease in interval size, the floating gate of the memory cell is an important factor in view of the capacitance coupled between floating and control gates of adjacent memory cells, as well as in view of capacitance coupled with the channel region of the memory cell.

In the cell string of the conventional nonvolatile memory device of FIG. 1, memory cells MC1 and MC32 are adjacent to the selection transistors SG1 and SG2, respectively. A memory cell MC2 is located on one side of memory cell MC1, and selection transistor SG1 is located on the other side of memory cell MC1. Also, a memory cell MC31 is located on one side of the memory cell MC32, and selection transistor SG2 is located on the other side of memory cell MC32. In addition, selection transistors SG1 and SG2 each have a different structure and operational voltage than that of memory cells MC1~MC32. Therefore, memory cells MC1 and MC32 adjacent to selection transistors SG1 and SG2, have different capacitive conditions than memory cells MC2~MC31.

Thus, in the conventional NAND-type nonvolatile semiconductor memory device, outer memory cells MC1 and MC32, which are adjacent to selection transistors SG1 and SG2, respectively, operate with different operational characteristics than memory cells MC2~MC31.

SUMMARY OF THE INVENTION

In one embodiment, the invention provides a nonvolatile semiconductor memory device comprising a cell string and a driver block. The cell string comprises a series of nonvolatile memory cells comprising a plurality of nonvolatile memory cells connected in series, wherein each nonvolatile memory cell is electrically erasable and programmable, a selection transistor connected to the series of nonvolatile memory cells, and a dummy cell interposed between and connected in series to the selection transistor and the series of nonvolatile memory cells. The driver block comprises a normal word line driver adapted to selectively activate any normal word line of a plurality of normal word lines, wherein an activated normal word line gates a corresponding nonvolatile memory cell of the plurality of nonvolatile memory cells, and a dummy word line driver adapted to activate a dummy word line to gate the dummy cell.

In another embodiment, the invention provides a nonvolatile semiconductor memory device comprising a cell string and a driver block. The cell string comprises a series of nonvolatile memory cells comprising a plurality of nonvolatile memory cells connected in series, wherein each nonvolatile memory cell is electrically erasable and programmable, and first and second selection transistors connected to the series of nonvolatile memory cells. The cell string further comprises a first dummy cell interposed between and connected in series to the first selection transistor and the series of nonvolatile memory cells, and a second dummy cell interposed between and connected in series to the second selection transistor and the series of nonvolatile memory cells. The driver block comprises a normal word line driver adapted to selectively activate any normal word line of a plurality of normal word lines, wherein an activated normal word line gates a corresponding nonvolatile memory cell of the plurality of nonvolatile memory cells, a first dummy word line driver adapted to activate a first dummy word line to gate the first dummy cell, and a second dummy word line driver adapted to activate a second dummy word line to gate the second dummy cell.

In yet another embodiment, the invention provides a nonvolatile semiconductor memory device comprising a cell string and a driver block. The cell string comprises a series of nonvolatile memory cells comprising a plurality of nonvolatile memory cells connected in series, wherein each nonvolatile memory cell is electrically erasable and programmable, and first and second selection transistors connected to the series of nonvolatile memory cells. The cell string further comprises a first dummy cell interposed between and connected in series to the first selection transistor and the series of nonvolatile memory cells, and a second dummy cell interposed between and connected in series to the second selection transistor and the series of nonvolatile memory cells. The a driver block comprises a normal word line driver adapted to selectively activate any normal word line of a plurality of normal word lines, wherein an activated normal word line gates a corresponding nonvolatile memory cell of the plurality of nonvolatile memory cells, and a dummy word line driver adapted to activate first and second dummy word lines to gate the first and second dummy cells, respectively.

BRIEF DESCRIPTION OF THE DRAWINGS

Exemplary embodiments of the invention will now be described with reference to the accompanying drawings, in which like reference symbols denote like elements. In the drawings:

FIG. 4 shows voltage levels of lines during various modes of operation of the exemplary embodiment of the nonvolatile semiconductor memory device illustrated in FIGS. 2 and 3.

DESCRIPTION OF EXEMPLARY EMBODIMENTS

Figure 1:
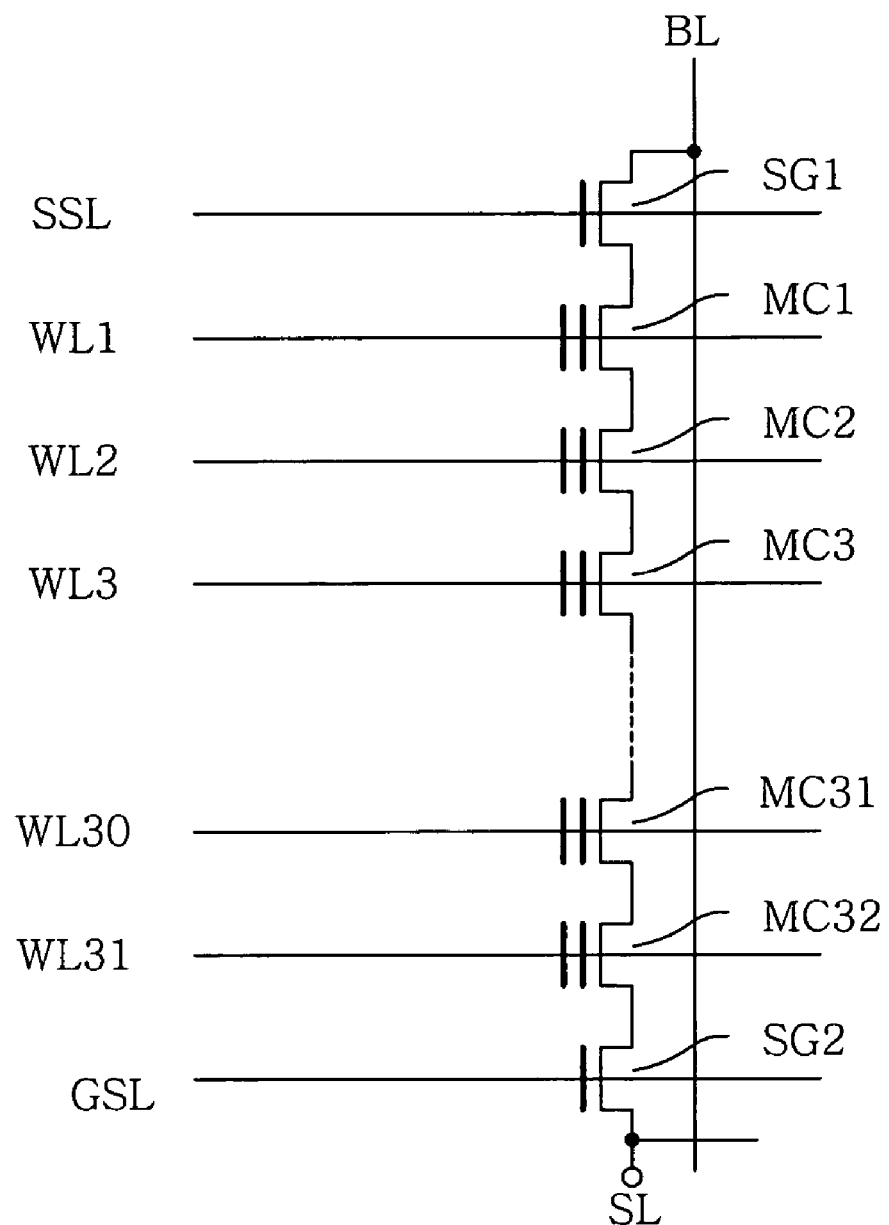
FIG. 1 is a circuit diagram showing a cell string of a conventional NAND-type nonvolatile semiconductor memory device.
Figure 2:
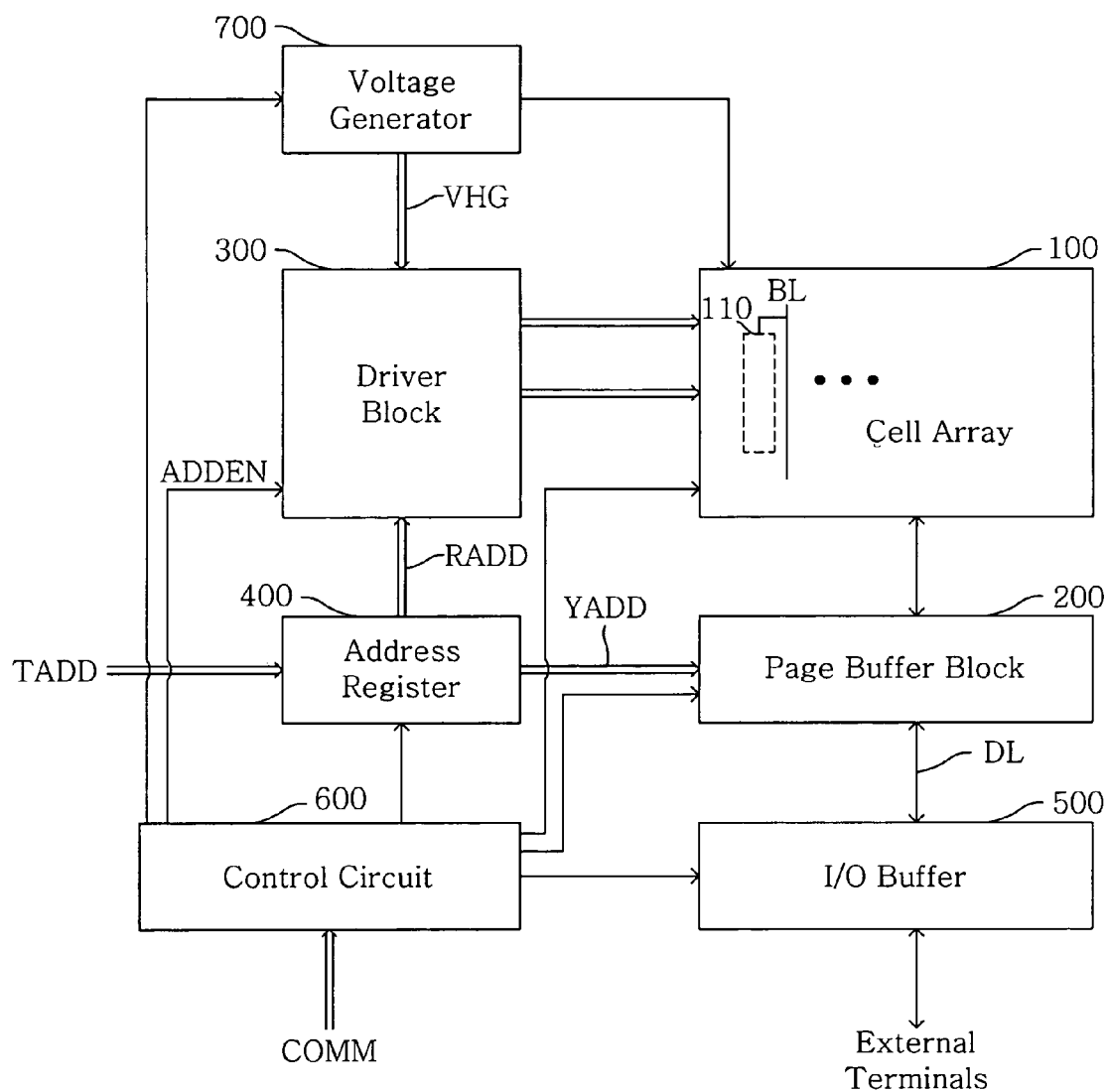
FIG. 2 is a block diagram illustrating a nonvolatile semiconductor memory device in accordance with an exemplary embodiment of the invention.

FIG. 2 is a block diagram illustrating a nonvolatile semiconductor memory device in accordance with an exemplary embodiment of the invention. A cell array 100 comprises a plurality of bit lines BL arranged at constant intervals, and a plurality of cell strings 110, each of which is coupled to a corresponding bit line BL.

A page buffer block 200 comprises a plurality of page buffers, each of which is connected to a corresponding bit line BL in cell array 100. Each page buffer functions as a detection circuit for sensing data from a corresponding bit line BL, or a data latch for temporarily holding data that will be provided to a corresponding bit line BL.

In addition, one of the page buffers connects to an input/output buffer 500 through a data line DL in response to a column selection address YADD. Input/output buffer 500 transmits/receives data to/from external terminals.

In cell array 100, normal word lines WL (of FIGS. 3 and 5) and dummy word lines DWL (of FIGS. 3 and 5) are selected and driven by a driver block 300. An address register 400 decodes an external address TADD, and then generates a row address RADD and column selection address YADD. Row address RADD is provided to driver block 300 and column selection address YADD is provided to driver block 300.

A control circuit 600 generates control signals for components of the device (i.e., cell array 100, page buffer block 200, driver block 300, and address register 400) in response to a control command COMM. That is, the control circuit 600 generates the control signals that enable the nonvolatile semiconductor memory device to perform programming, erasing, and data reading operations. Also, a voltage generator 700 outputs various voltages VHG required to perform the various operations of the device.

The voltages VHG comprise a program voltage Vpgm, a pass voltage Vpass, a reference voltage Vr, and a read voltage Vread. During the programming operation of the nonvolatile semiconductor memory device, program voltage Vpgm is applied to a selected memory cell and pass voltage Vpass is applied the non-selected memory cells. During the read operation of the nonvolatile semiconductor memory device, reference voltage Vr is applied to the selected memory cell and read voltage Vread is applied to the non-selected memory cells.

Figure 3:
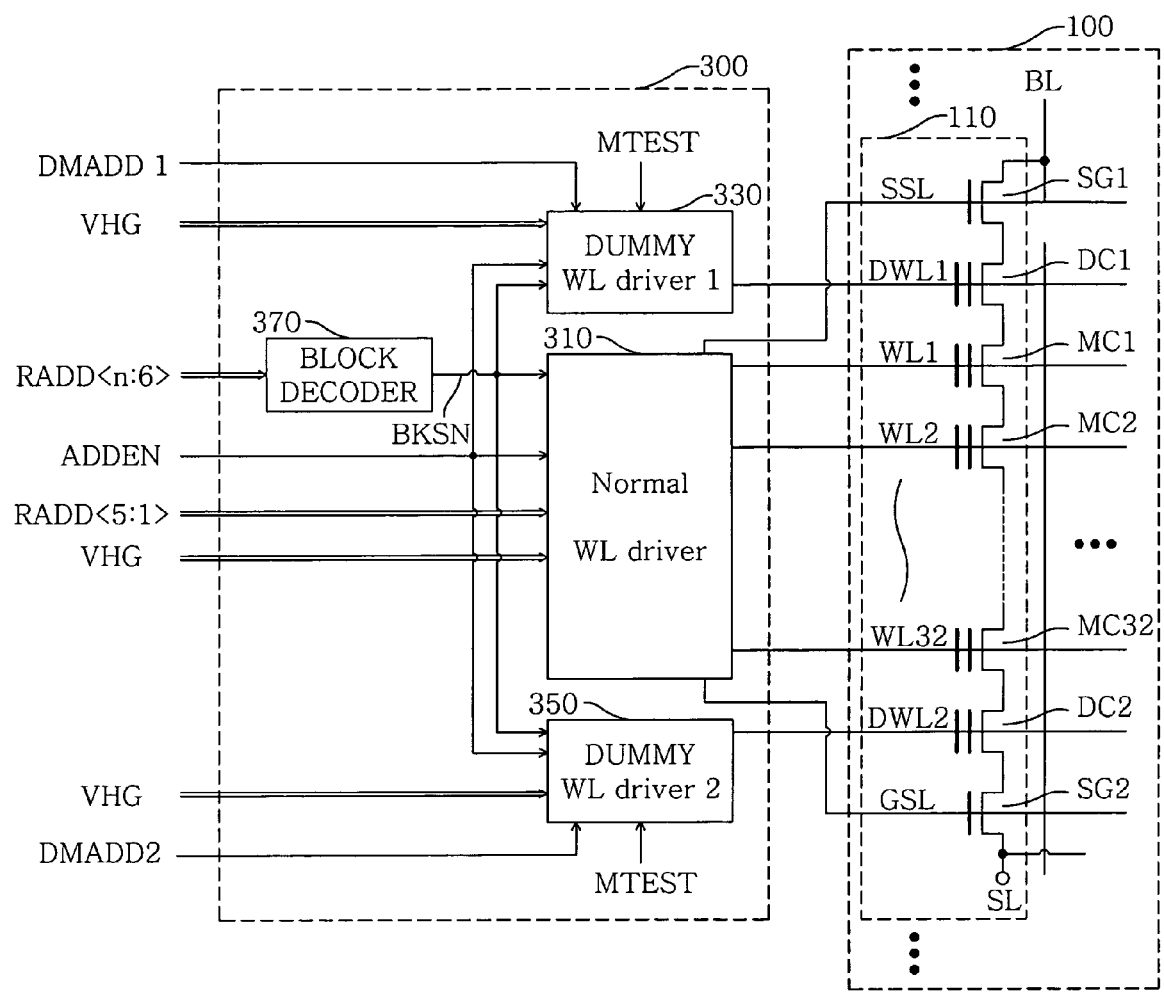
FIG. 3 is a circuit diagram illustrating an exemplary configuration of the cell array and driver block of FIG. 2.

The structure of cell string 110 of the nonvolatile semiconductor memory device, in accordance with an exemplary embodiment of the invention, will now be described. FIG. 3 is a circuit diagram illustrating an exemplary configuration of cell array 100 and driver block 300 of FIG. 2.

In FIG. 3, only a single bit line BL (representative of the plurality of bit lines BL) and a single cell string 110 (representative of the plurality of cell strings 110) are illustrated in cell array 100. Also, memory cells MC1~MC32 and first and second dummy cells DC1 and DC2 are illustrated as part of the exemplary configuration of cell array 100. The configuration illustrated in FIG. 3 is provided as one example. The scope of the invention is not limited to only this particular configuration.

Referring to FIG. 3, cell array 100 comprises the plurality of bit lines BL arranged at constant intervals, and the plurality of cell strings 110, each of which is connected to a corresponding bit line BL. Each cell string comprises a plurality of nonvolatile memory cells MC1~MC32, first and second selection transistors SG1 and SG2, and first and second dummy cells DC1 and DC2, which are all connected in series within the cell string.

Memory cells MC1~MC32 are all electrically programmable and erasable. First selection transistor SG1 is located at one end of cell string 110 and connects memory cells MC1~MC32 to bit line BL in response to a string selection signal SSL. Second selection transistor SG2 is located at the other end of cell string 110 and connects memory cells MC1~MC32 to source line SL in response to ground selection signal GSL.

It is generally preferred that the gate widths of each of first and second selection transistors SG1 and SG2 are greater than the gate widths of the transistors that form memory cells MC1~MC32.

First and second dummy cells DC1 and DC2 are not used for storing data. First dummy cell DC1 is interposed between and connected in series to first selection transistor SG1 and memory cell MC1, and second dummy cell DC2 is interposed between and connected in series to second selection transistor SG2 and memory cell MC32. In this exemplary embodiment, the transistors that form first and second dummy cells DC1 and DC2 are the same size as the transistors that form memory cells MC1~MC32. Use of first and second dummy cells DC1 and DC2 improves the uniformity of the electrical stability over the left and right sides of memory cells MC1 and MC32, each of which is located at a respective end of the cell string. As a result, the electrical stability of memory cells MC1 and MC32 is like that of memory cells MC2~MC31, which are arranged between memory cells MC1 and MC32.

Therefore, the physical conditions of adjacent memory cells are equalized in a nonvolatile semiconductor memory device comprising a cell string structure in accordance with that of the exemplary embodiment of the invention described above. As a result, a data programming operation may be carried out using the same programming operation characteristics in all memory cells of the device. Likewise, a data erasing operation may be carried out using the same erase operation characteristics in all memory cells of the device.

While cell string 110 comprises 32 memory cells (memory cells MC1~MC32) in the exemplary embodiments of this description, a cell string may also comprise 16 or 64 memory cells.

Driver block 300 comprises a normal word line driver 310, and first and second dummy word line drivers 330 and 350.

Normal word line driver 310 is adapted to activate any one of the normal word lines WL1~WL32. When normal word line driver 310 activates a selected normal word line, the selected normal word line gates the corresponding memory cell. For example, when the selected normal word line is WL1, selected normal word line WL1 gates memory cell MC1. When normal word line driver 310 is enabled, it activates one of normal word lines WL1~WL32. Normal word line driver 310 selects which normal word line to activate in accordance with row address RADD<5:1>. Also, when first and second dummy word line drivers 330 and 350 are enabled, they activate first and second dummy word lines DWL1 and DWL2, respectively. First and second dummy word lines DWL1 and DWL2 gate first and second dummy cells DC1 and DC2, respectively.

When a row address RADD<n:6> that corresponds to a block decoder 370 is generated, block decoder 370 provides a block selection signal BKSN to normal word line driver 310, and to first and second dummy word line drivers 330 and 350. After receiving block selection signal BKSN, normal word line driver 310, and first and second dummy word line drivers 330 and 350 will be enabled in response to an address enable signal ADDEN. That is, normal word line driver 310, and first and second dummy word line drivers 330 and 350 are enabled in response to ADDEN only after receiving BKSN. Normal word line driver 310, and first and second dummy word line drivers 330 and 350 receive address enable signal ADDEN from control circuit 600 (of FIG. 2).

Therefore, in this exemplary embodiment, when one of normal word lines WL1~WL32 is activated, first and second dummy word lines DWL1 and DWL2 are also activated.

Furthermore, in this exemplary embodiment, first and second dummy word lines DWL1 and DWL2 may each be activated independently during a test operation. During a test mode, wherein a test signal MTEST is activated and provided to first and second dummy word line drivers 330 and 350, first and second dummy word line drivers 330 and 350 are enabled in response to first and second dummy addresses DMADD1 and DMADD2, respectively. Thus, first and second dummy word lines DWL1 and DWL2 may be activated independently of each other and independently of the normal word lines WL1~WL32.

Because first and second dummy word lines DWL1 and DWL2 can be activated independently of each other and of the normal word lines WL1~WL32 it is possible to perform various test functions for the memory cells MC1 and MC32 adjacent to first and second dummy cells DC1 and DC2.

First and second dummy addresses DMADD1 and DMADD2 may be specific address bits among row address RADD<n:1> or additional address bits.

In accordance with another exemplary embodiment, first and second dummy word line drivers 330 and 350 are enabled in response to block selection signal BKSN. When first and second dummy word line drivers 330 and 350 are enabled, first and second dummy word lines DWL1 and DWL2 are activated.

In the nonvolatile semiconductor memory device of the present invention, first and second dummy word lines DWL1 and DWL2 may have different voltage levels when activated than normal word lines WL1~WL32 have when activated. FIG. 4 shows voltage levels of lines during various modes of operation of the exemplary embodiment of the nonvolatile semiconductor memory device illustrated in FIGS. 2 and 3.

Referring to FIG. 4, the voltages of normal word lines WL1~WL32, first dummy word line DWL1, and second dummy word line DWL2, which are applied to the gates of memory cells MC1~MC32, first dummy cell DC1, and second dummy cell DC2, respectively, are set to 0V during an erase operation. During a programming operation, the normal word line that corresponds to a selected memory cell has program voltage Vpgm. Also, first dummy word line DWL1, second dummy word line DWL2, and the normal word lines that correspond to non-selected memory cells each have pass voltage Vpass during the programming operation.

During a read operation or a verifying operation associated with the programming and erasing operations, a selected word line of normal word lines WL1~WL32 has reference voltage Vr while the non-selected word lines of normal word lines WL1~WL32 each have read voltage Vread. During either of these operations, dummy word lines DWL1 and DWL2 each have a voltage Vread+α that is greater than read voltage Vread. As used herein, α is a value that is greater than 0.

Dummy word lines DWL1 and DWL2 each have a voltage that is greater than the voltage of the non-selected normal word lines because it is necessary to use first and second dummy cells DC1 and DC2 to prevent data distortion during the verifying operation.

Figure 5:
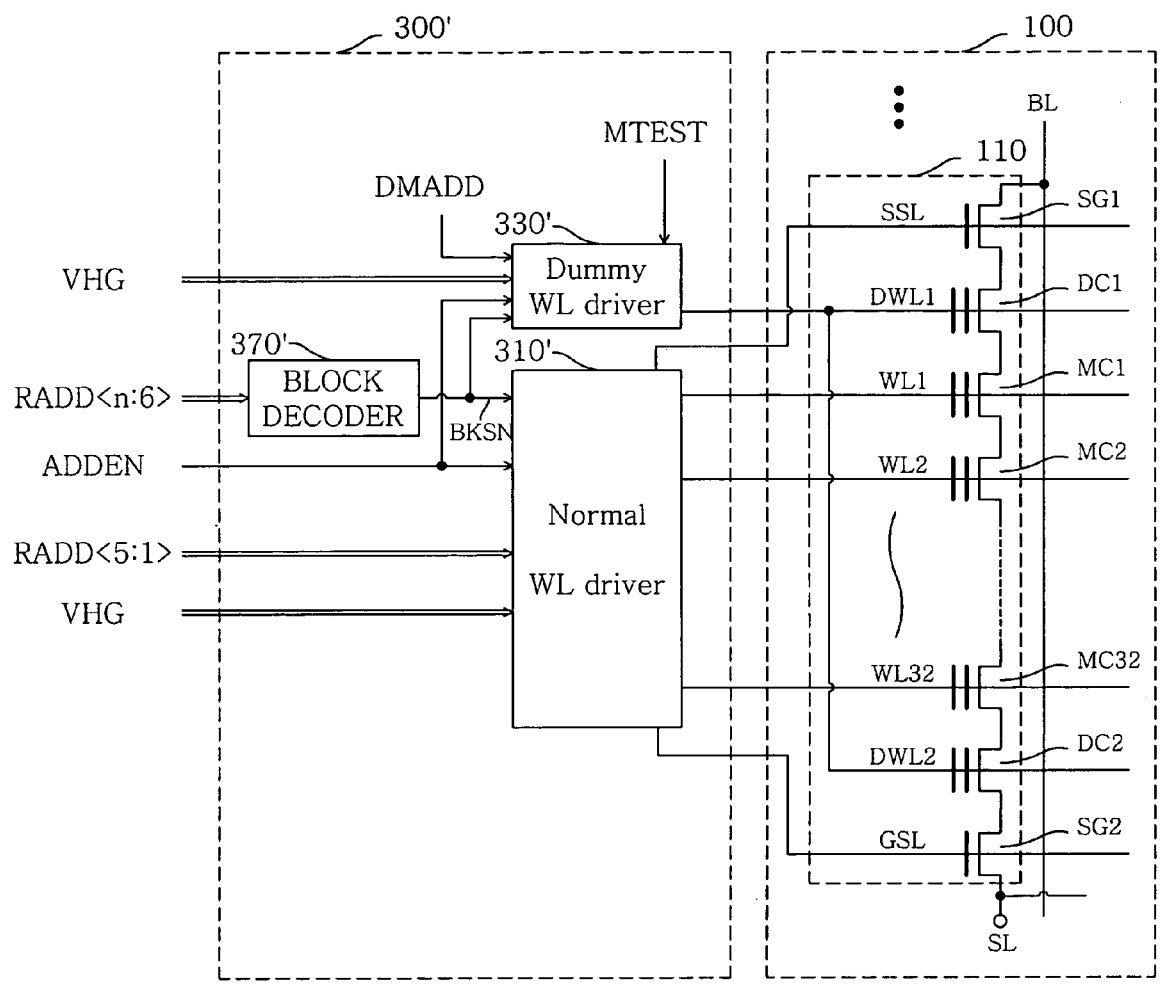
FIG. 5 is a circuit diagram illustrating another exemplary configuration of the cell array and driver block of FIG. 2.

FIG. 5 is a circuit diagram illustrating another exemplary configuration of cell array 100 and driver block 300 of FIG. 2. Driver block 300' of the exemplary embodiment of FIG. 5 is similar to driver block 300 of the exemplary embodiment of FIG. 3. However, first and second dummy word lines DWL1 and DWL2 are both controlled by a single dummy word line driver 330' in the exemplary embodiment of FIG. 5, while first and second dummy word lines DWL1 and DWL2 may be controlled independently by first and second dummy word line drivers 330 and 350, respectively, in the exemplary embodiment illustrated in FIG. 3. Additionally, while test signal MTEST is activated (i.e., during the test mode), dummy word line driver 330' is enabled in response to dummy address DMADD, and first and second dummy word lines DWL1 and DWL2 are both activated when dummy word line driver 330' is enabled.

The structures of memory cells MC1~MC32, first and second dummy cells DC1 and DC2, and first and second selection transistors SG1 and SG2 are the same in the exemplary embodiment of FIG. 5 as in the exemplary embodiment of FIG. 3. Also, the arrangement of memory cells MC1~MC32, first and second dummy cells DC1 and DC2, and first and second selection transistors SG1 and SG2 are the same in the exemplary embodiment of FIG. 5 as in the exemplary embodiment of FIG. 3, except that second dummy word line DWL2 is connected to first dummy word line DWL1 and is controlled by dummy word line driver 330' as described above. Similarly, the voltage levels of normal word lines WL1~WL32 and dummy word lines DWL1~DWL2 during the operation modes described with reference to FIG. 4 are the same in the exemplary embodiment of FIG. 5 as in the exemplary embodiment of FIG. 3. Since the above features are the same in the exemplary embodiment of FIG. 5 as in the exemplary embodiment of FIG. 3 another description of these features will not be included hereinafter.

The circuit architecture and control operation of the exemplary embodiment of FIG. 5 is simpler than that of the exemplary embodiment of FIG. 3, and the exemplary embodiment of FIG. 5 does not require as large a layout area as the exemplary embodiment of FIG. 3.

In accordance with the nonvolatile semiconductor memory device of the invention, the first dummy cell is interposed between and connected in series to the first selection transistor and the first memory cell (e.g., MC1), and the second dummy cell is interposed between and connected in series to the second selection transistor and the last memory cell (e.g., MC32). The transistors that form the first and second dummy cells are the same size as the transistors that form the memory cells. Thus, in the nonvolatile semiconductor memory device with the cell string structure of the invention, each memory cells has the same physical conditions as the cells adjacent to it. As a result, the nonvolatile semiconductor memory device of the invention may operate using the same programming operation characteristics over all of the memory cells of the device as well as the same erasing operation characteristics over all the memory cells of the device.

Although the present invention has been described in accordance with exemplary embodiments of the present invention, the invention is not limited to the exemplary embodiments. It will be understood by those skilled in the art that various substitutions, modifications, and changes may be made to the exemplary embodiments without departing from the scope of the invention. Therefore, the present invention is not intended to be limited to the exemplary embodiments disclosed, but rather the invention is intended to include all embodiments falling within the scope of the appended claims.

What is claimed is:

1. A nonvolatile semiconductor memory device comprising:
   a cell string comprising:
      a series of nonvolatile memory cells comprising a plurality of nonvolatile memory cells connected in series, wherein each nonvolatile memory cell is electrically erasable and programmable,
      a selection transistor connected to the series of nonvolatile memory cells, and
      a dummy cell interposed between and connected in series to the selection transistor and the series of nonvolatile memory cells; and,
   a driver block comprising:
      a normal word line driver adapted to selectively drive one of a plurality of word line voltages onto a plurality of normal word lines gating the plurality of nonvolatile memory cells, and
      a dummy word line driver adapted to drive one of a plurality of dummy word line voltages onto a dummy word line gating the dummy cell.

2. The nonvolatile semiconductor memory device of claim 1, wherein the normal word line driver is further adapted to drive one of the plurality of word line voltages onto each one of the plurality of normal word lines in accordance with whether a memory cell corresponding to the normal word line has been selected or non-selected by a first part of a row address.

3. The nonvolatile semiconductor memory device of claim 2, wherein the normal word line driver and the dummy word line driver are enabled in accordance with a second part of the row address.

4. The nonvolatile semiconductor memory device of claim 1, wherein the dummy word line driver is enabled in response to receiving both a test signal and a dummy address.

5. A nonvolatile semiconductor memory device, comprising:
   a series connected string of first through Nth nonvolatile memory cells connected between first and second selection transistors;
   first and second dummy cells interposed respectively between the first selection transistor and the first nonvolatile memory cell, and between the Nth nonvolatile memory cell and the second selection transistor;
   wherein each nonvolatile memory cell is gated by a corresponding normal word line, and each one of the first and second dummy cells is gated by a corresponding dummy word line; and
   a driver block comprising a normal word line driver and a dummy word line driver, the dummy word line driver being independently operable with respect to the normal word line driver in relation to a received address.

6. The nonvolatile semiconductor memory device of claim 5, wherein the dummy word line driver applies a dummy word line voltage to each one of the first and second dummy cells that varies in relation to a plurality of operations performed by the nonvolatile semiconductor memory device.

7. The nonvolatile semiconductor memory device of claim 6, wherein during a read operation, the normal word line driver applies a first word line voltage to normal word lines associated with nonvolatile memory cells selected by the address, and a second word line voltage to normal word lines associated with nonvolatile memory cells non-selected by the address, and
   the dummy word line driver applies a third voltage higher than the second voltage to the first and second dummy cells.

8. The nonvolatile semiconductor memory device of claim 6, wherein during a verifying operation associated with a programming or erase operation, the normal word line driver applies a first word line voltage to normal word lines associated with nonvolatile memory cells selected by the address, and a second word line voltage to normal word lines associated with nonvolatile memory cells non-selected by the address, and
   the dummy word line driver applies a third voltage higher than the second voltage to the first and second dummy cells.

9. The nonvolatile semiconductor memory device of claim 5, wherein the dummy word line driver comprises a first dummy word line driver associated with the first dummy cell and a second dummy word line driver associated with the second dummy cell.

10. The nonvolatile semiconductor memory device of claim 9, wherein the first and second dummy word line drivers are separately addressable by the address.

11. The nonvolatile semiconductor memory device of claim 10, further comprising:
   a block decoder receiving the address and providing a block selection signal to the first and second dummy word line drivers.

12. The nonvolatile semiconductor memory device of claim 9, wherein the first the second dummy word line drivers are independently activated during a test mode operation by the address and an applied test signal.

13. The nonvolatile semiconductor memory device of claim 5, wherein the nonvolatile memory cells are NAND flash memory cells.

* * * * *